US006972246B2

(12) United States Patent
Nakano et al.

(10) Patent No.: US 6,972,246 B2
(45) Date of Patent: Dec. 6, 2005

(54) METHOD FOR MANUFACTURING AN ORIENTED CRYSTALLINE SEMICONDUCTOR USING A PULSED LASER

(75) Inventors: Kazushi Nakano, Tokyo (JP); Yukihisa Hitsuda, Kanagawa (JP); Toshio Fujino, Kanagawa (JP); Michinori Shiomi, Kanagawa (JP); Junichi Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 5 days.

(21) Appl. No.: 10/856,138

(22) Filed: May 28, 2004

(65) Prior Publication Data

US 2005/0006646 A1 Jan. 13, 2005

(30) Foreign Application Priority Data

Jun. 10, 2003 (JP) .......................... P2003-165119

(51) Int. Cl.[7] .............................................. H01L 21/20
(52) U.S. Cl. ...................................... 438/487; 438/486
(58) Field of Search ................................ 438/482, 486, 438/487

(56) References Cited

U.S. PATENT DOCUMENTS

2003/0104662 A1 * 6/2003 Hatano et al. .............. 438/166
2003/0211666 A1 * 11/2003 Okumura .................... 438/151

FOREIGN PATENT DOCUMENTS

JP 3344418 8/2002

* cited by examiner

*Primary Examiner*—Brad Smith
(74) *Attorney, Agent, or Firm*—Bell, Boyd & Lloyd LLC

(57) ABSTRACT

A manufacturing method for a crystalline semiconductor material including a plurality of semiconductor crystal grains is provided. The manufacturing method includes forming an amorphous or polycrystalline semiconductor layer on a substrate having a flat surface; forming a plurality of projections each having a side wall surface substantially perpendicular to the flat surface of the substrate, a height set in the range of about 1 nm to less than or equal to about ¼ of the thickness of the semiconductor layer, and a lateral dimension set in the range of about 3 $\mu$m to about 18 $\mu$m in a direction parallel to the flat surface of the substrate; and heating the semiconductor layer a number of times by using a pulsed laser thereby forming the crystalline semiconductor material including the crystal grains each having a specific plane orientation with respect to a direction perpendicular to the flat surface of the substrate so that the crystal grains respectively correspond to the projections. Accordingly, the position, size, and plane orientation of a crystal can be controlled by a simple step, and a crystalline semiconductor material excellent in planarity as a film can be formed.

18 Claims, 6 Drawing Sheets

F I G. 4 A
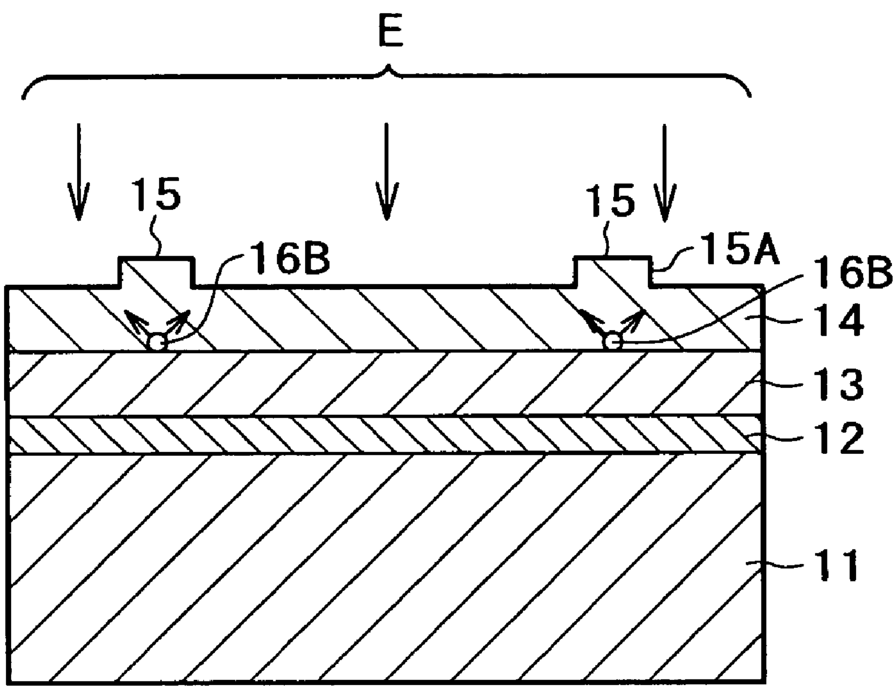
F I G. 4 B
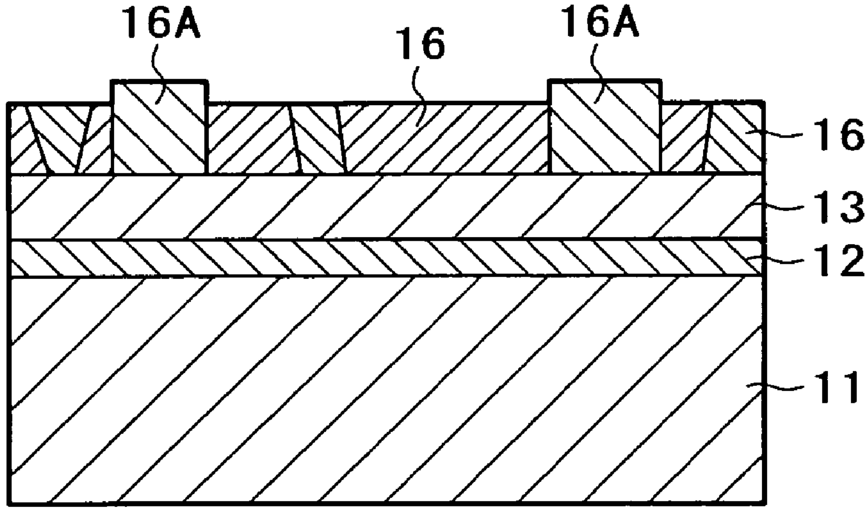

METHOD FOR MANUFACTURING AN ORIENTED CRYSTALLINE SEMICONDUCTOR USING A PULSED LASER

CROSS REFERENCES TO RELATED APPLICATIONS

This application claims priority to Japanese Patent Application No. P2003-165119, filed on Jun. 10, 2003, the disclosure of which is incorporated by reference herein.

BACKGROUND OF THE INVENTION

The present invention relates to a manufacturing method for a crystalline semiconductor material wherein an amorphous or polycrystalline semiconductor layer is heated for crystallization, and also to a manufacturing method for a semiconductor device using the above manufacturing method for the crystalline semiconductor material.

In recent years, attention has been paid to a technique of forming a semiconductor thin film on a substrate of an amorphous dielectric material such as a glass material or plastic material and fabricating a semiconductor element such as a thin-film transistor (TFT) by using this semiconductor thin film. In actual, such a technique is applied to a switching element, drive circuit, and the like for each pixel in a liquid crystal display. Further, for a higher scale of integration and multifunctionality of a semiconductor device, research and development are being pursued on a three-dimensional integrated circuit or the like wherein such semiconductor elements as mentioned above are layered on the substrate.

In the case of a TFT, a polycrystalline silicon (Si) thin film formed on the substrate mentioned above is frequently used as an operating region (channel region). A conventional forming method for a polycrystalline silicon thin film includes the steps of forming an amorphous silicon thin film on a dielectric substrate, directing a laser beam to the amorphous silicon thin film to melt and crystallize it. This method has been developed as laser annealing and put to practical use. To uniform the device characteristics of TFTs using such a polycrystalline silicon thin film, it is preferable to make the sizes or plane orientations of crystal grains in the polycrystalline silicon thin film as uniform as possible.

In this conventional method, however, it is impossible to control the position or size of each crystal grain. Further, grain boundaries are randomly present in the polycrystalline silicon thin film formed, and the plane orientations of the crystal grains are different from each other. Accordingly, the device characteristics, reliability, and uniformity of semiconductor elements such as TFTs using a polycrystalline silicon film are considerably inferior to those of semiconductor elements using single-crystal silicon.

Disclosed in Japanese Patent No. 3344418 is a technique of increasing the size of each crystal grain by using a resist pattern having gentle steps to etch an amorphous silicon film, thereby forming unevennesses on the amorphous silicon film, and next directing a laser beam to the amorphous silicon film. However, this method is complicated because the gentle steps must be formed on a resist. Further, the unevennesses formed on the amorphous silicon film are transferred to a polycrystalline silicon film, causing a degradation in planarity. As a result, there is a possibility of adverse effect on the characteristics of semiconductor elements formed by using this polycrystalline silicon film.

SUMMARY OF THE INVENTION

The present invention relates to a manufacturing method for a crystalline semiconductor material wherein an amorphous or polycrystalline semiconductor layer is heated for crystallization, and also to a manufacturing method for a semiconductor device using the above manufacturing method for the crystalline semiconductor material.

In an embodiment, the present invention provides a manufacturing method for a crystalline semiconductor material wherein the position, size, and plane orientation of a crystal can be controlled by a simple step, and a crystalline semiconductor material excellent in planarity as a film can be formed.

In an embodiment, the present invention provides a manufacturing method for a semiconductor device using the manufacturing method for the crystalline semiconductor material mentioned above.

In accordance with an embodiment of the present invention, there is provided a manufacturing method for a crystalline semiconductor material having a plurality of semiconductor crystal grains, including forming an amorphous or polycrystalline semiconductor layer on a substrate having a flat surface; forming a plurality of projections each having a side wall surface substantially perpendicular to the flat surface of the substrate, a height set in the range of about 1 nm to less than or equal to about ¼ of the thickness of the semiconductor layer, and a lateral dimension set in the range of about 3 $\mu$m to about 18 $\mu$m in a direction parallel to the flat surface of the substrate; and heating the semiconductor layer a number of times by using a pulsed laser to thereby form the crystalline semiconductor material including the crystal grains each having a specific plane orientation with respect to a direction perpendicular to the flat surface of the substrate so that the crystal grains respectively correspond to the projections.

In accordance with another embodiment of the present invention, there is provided a manufacturing method for a semiconductor device using a crystalline film having a plurality of semiconductor crystal grains, including forming an amorphous or polycrystalline semiconductor layer on a substrate having a flat surface; forming a plurality of projections each having a side wall surface substantially perpendicular to the flat surface of the substrate, a height set in the range of about 1 nm to less than or equal to about ¼ of the thickness of the semiconductor layer, and a lateral dimension set in the range of about 3 $\mu$m to about 18 $\mu$m in a direction parallel to the flat surface of the substrate; heating the semiconductor layer a number of times by using a pulsed laser to thereby form the crystalline semiconductor material including the crystal grains each having a specific plane orientation with respect to a direction perpendicular to the flat surface of the substrate so that the crystal grains respectively correspond to the projections; and forming a number of semiconductor elements so that the crystal grains included in the crystalline film function as operating regions of the semiconductor elements.

According to the manufacturing method for the crystalline semiconductor material of the present invention in an embodiment, the projections are formed on the amorphous or polycrystalline semiconductor layer formed on the substrate. The side wall surface of each projection is substantially perpendicular to the flat surface of the substrate. The height of each projection is set in the range of about 1 nm to less than or equal to about ¼ of the thickness of the semiconductor layer. The lateral dimension of each projection in a direction parallel to the flat surface of the substrate is set in the range of about 3 $\mu$m to about 18 $\mu$m. Thus, the height of each projection is small, so that the planarity of the crystalline material or the crystalline film is improved. Further, since the side wall surface of each projection is substantially perpendicular to the flat surface of the substrate, the step of forming each projection can be simplified. Further, the crystalline semiconductor material or crystalline film including the crystal grains each having a specific plane orientation with respect to a direction perpendicular to the flat surface of the substrate is formed so that the crystal grains respectively correspond to the projections, by using a pulsed laser to heat the semiconductor layer plural times. By controlling the heating conditions, the size of each crystal grain can be controlled to a desired size, and each crystal grain is preferentially oriented in a specific plane orientation with respect to the direction perpendicular to the flat surface of the substrate.

According to the manufacturing method for the semiconductor device of the present invention in an embodiment, the crystalline film is formed from the crystalline semiconductor material by the manufacturing method for the crystalline semiconductor material of the present invention. Thereafter, the semiconductor elements are formed so that the crystal grains included in the crystalline film function as operating regions of the semiconductor elements.

According to the manufacturing method for the crystalline semiconductor material of the present invention in an embodiment, the height of each projection is set in the range of 1 nm to less than or equal to ¼ of the thickness of the semiconductor layer. Accordingly, the planarity of the crystalline semiconductor material as a film can be improved, and the performance of the semiconductor device can therefore be improved. Further, since the side wall surface of each projection is substantially perpendicular to the flat surface of the substrate, the step of forming each projection can be simplified. Further, the crystalline semiconductor material including the crystal grains each having a specific plane orientation with respect to a direction perpendicular to the flat surface of the substrate is formed so that the crystal grains respectively correspond to the projections, by using a pulsed laser to heat the semiconductor layer plural times. Accordingly, a crystal grain controlled in size and plane orientation at each projection can be formed.

According to the manufacturing method for the semiconductor device of the present invention in an embodiment, a crystalline film having crystal grains is formed from the crystalline semiconductor material of the present invention, and a semiconductor element is formed so that each crystal grain included in the crystalline film functions as an operating region. Accordingly, a semiconductor device having semiconductor elements having high performance and uniform characteristics can be fabricated.

Additional features and advantages of the present invention are described in, and will be apparent from, the following Detailed Description of the Invention and the figures.

BRIEF DESCRIPTION OF THE FIGURES

FIGS. 4A and 4B are sectional views showing the third step subsequent to the second step shown in FIGS. 2A and 2B.

DETAILED DESCRIPTION OF THE INVENTION

The present invention relates to a manufacturing method for a crystalline semiconductor material wherein an amorphous or polycrystalline semiconductor layer is heated for crystallization, and also to a manufacturing method for a semiconductor device using the above manufacturing method for the crystalline semiconductor material. Various embodiments of the present invention will now be described in detail below with reference to the drawings.

Figure 2A:
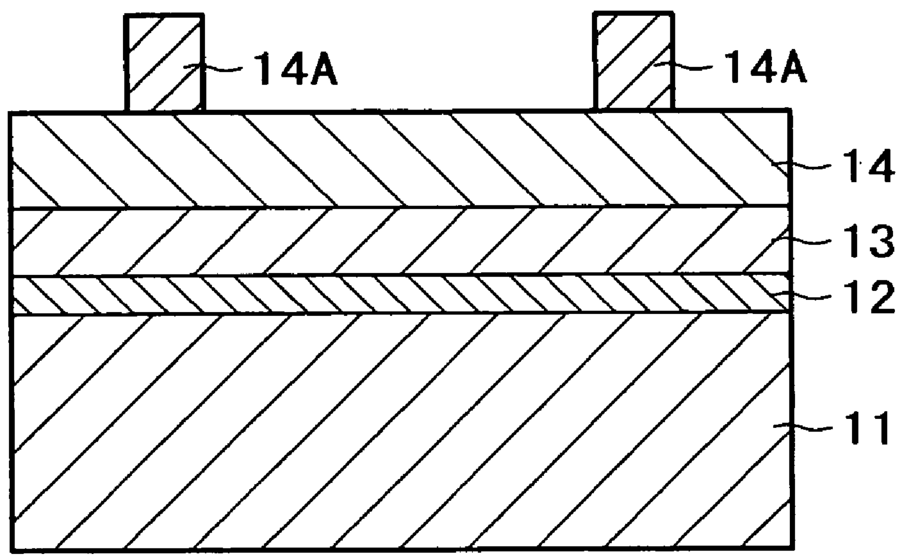
FIGS. 2A and 2B are sectional views showing the second step subsequent to the first step shown in FIGS. 1A and 1B.
Figure 2B:
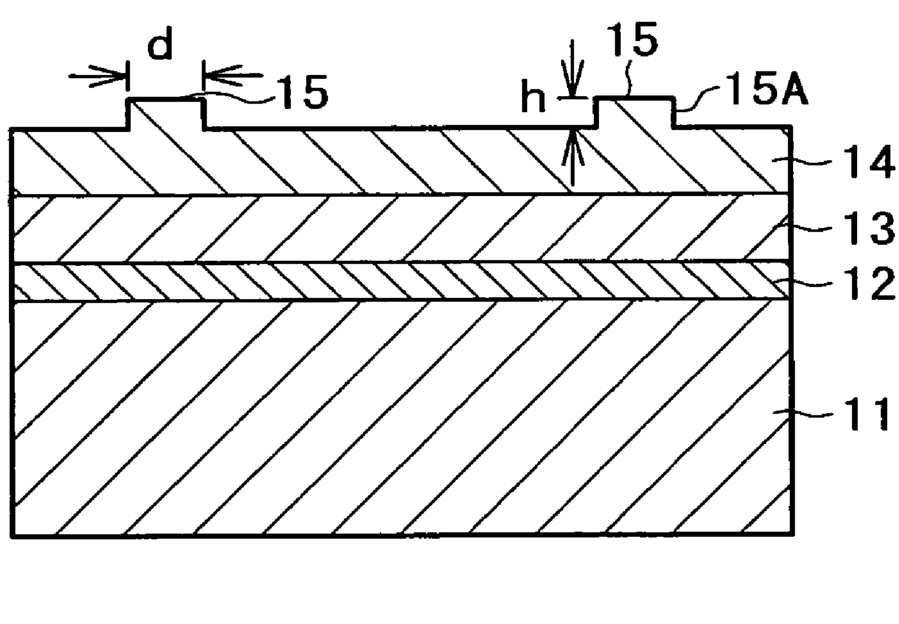
Figure 3:
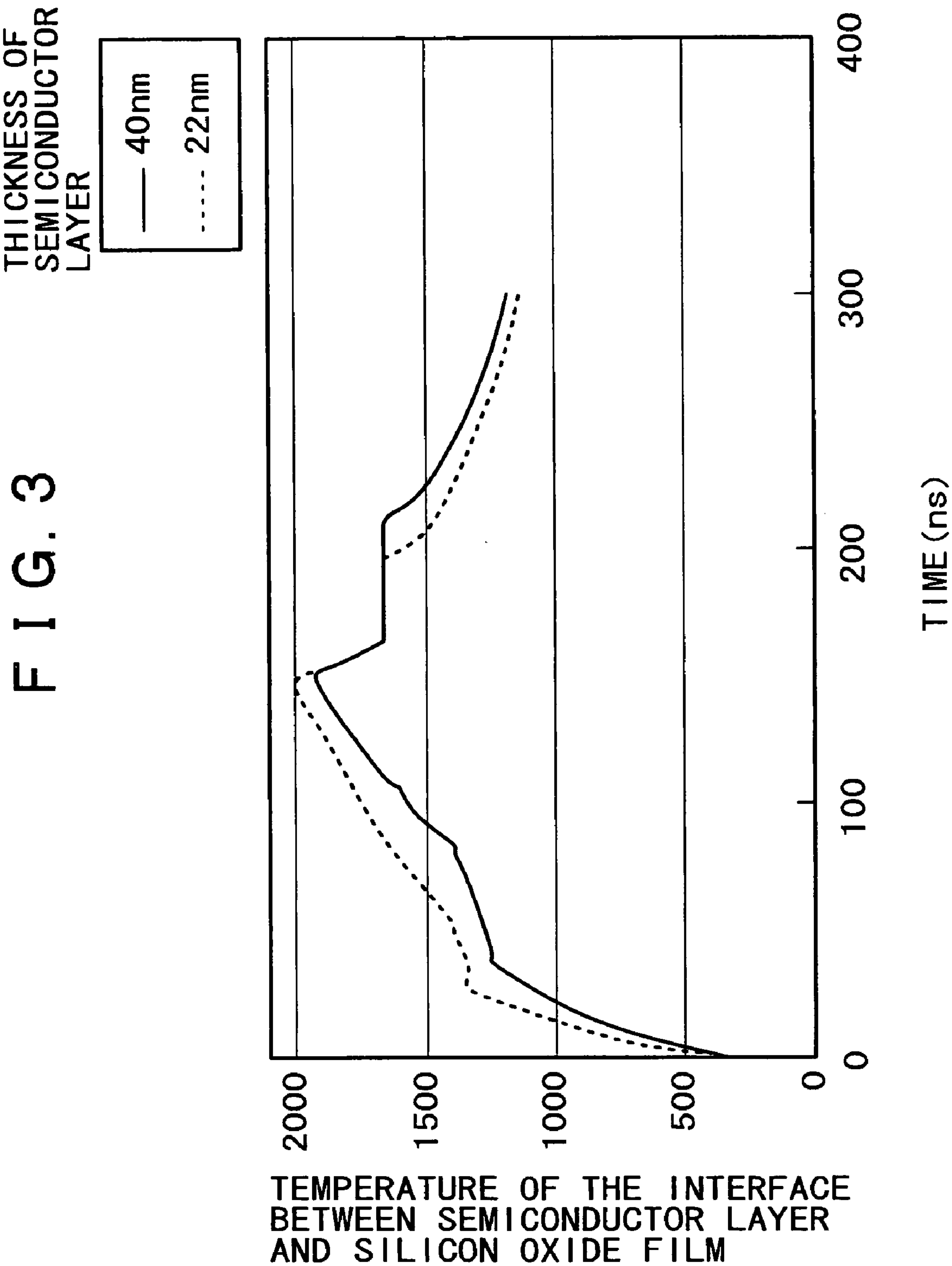
FIG. 3 is a graph showing the results of simulation of changes in temperature of the interface between a semiconductor layer and a silicon oxide film in the cases that the thickness of the semiconductor layer was set to 22 nm and 40 nm.

FIGS. 1A to 5B except FIG. 3 show the sequential steps of a manufacturing method for a crystalline semiconductor material and a manufacturing method for a semiconductor device subsequent thereto according to a preferred embodiment of the present invention. The manufacturing method for the crystalline semiconductor material includes forming an amorphous or polycrystalline semiconductor layer on a substrate having a flat surface, forming a number of projections on the semiconductor layer, and heating said semiconductor layer a number of times by using a pulsed laser to thereby form a crystalline semiconductor material including a number of crystal grains respectively corresponding to the projections, each of the crystal grains having a specific plane orientation with respect to a direction perpendicular to the flat surface of the substrate. In the following description, a silicon crystal having {100} plane orientations, for example, means a crystal preferentially oriented in <100> directions.

Figure 1A:
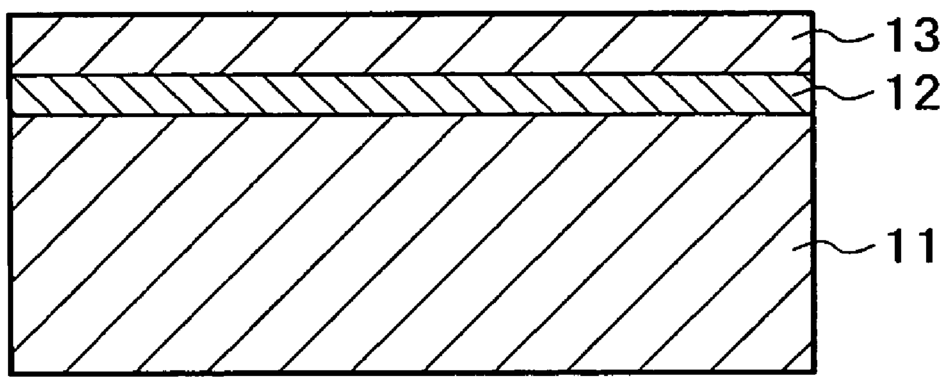
FIGS. 1A and 1B are sectional views showing the first step of a manufacturing method for a crystalline semiconductor material according to a preferred embodiment of the present invention.

As shown in FIG. 1A, a dielectric substrate 11 having a flat surface is prepared. An amorphous dielectric material such as glass or plastic can be used as the material of the substrate 11 in an embodiment. In this preferred embodiment, a glass substrate is used as the substrate 11.

As shown in FIG. 1A, a silicon nitride film 12 and a silicon oxide film 13 are formed in this order on the substrate 11 by CVD (Chemical Vapor Deposition) or sputtering, for example. The silicon nitride film 12 has a function as a protective film, which prevents contamination of a semiconductor layer 14, such as of a crystalline film (to be formed later) with impurities contained in the substrate 11. The silicon oxide film 13 has a function as a protective film and an additional function as a buffer layer for providing adaptation of the semiconductor layer 14 to the silicon nitride film 12. The thickness of the silicon nitride film ($SiN_x$ where x is an arbitrary positive number) 12 in the direction of film deposition (which thickness in the direction of film deposition will be hereinafter referred to as the thickness) can be set to about 50 nm, for example. As the material of the silicon oxide film 13, silicon dioxide ($SiO_2$) can be used, and the thickness of the silicon oxide film 13 can be set to about 120 nm, for example.

Figure 1B:
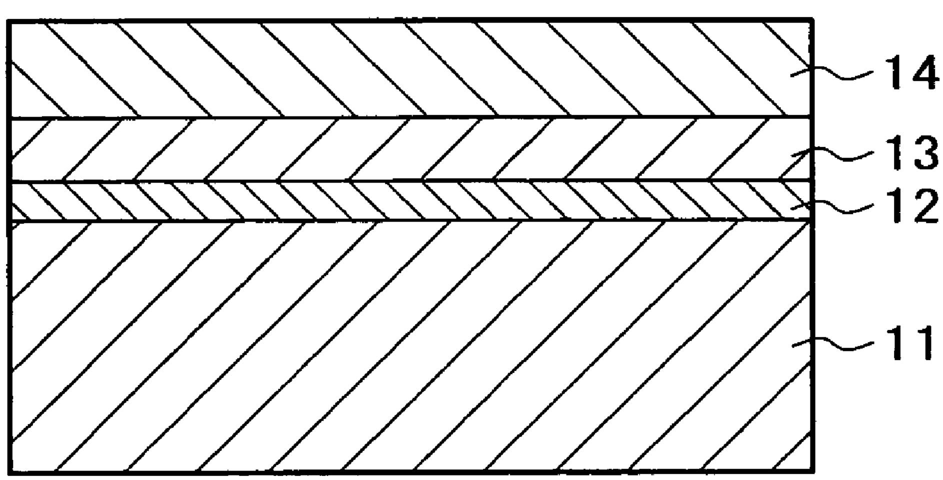

As shown in FIG. 1B, a semiconductor layer 14 of amorphous silicon, for example, is formed on the silicon oxide film 13 by CVD, PECVD (Plasma Enhanced Chemical Vapor Deposition), or sputtering, for example. The thickness of the semiconductor layer 14 is preferably set in the range of about 40 nm to about 70 nm, for example. If the thickness of the semiconductor layer 14 is less than about 40 nm, the resistance in an operating region (channel region) is increased in fabricating a semiconductor element such as a TFT (see FIG. 5A). If the thickness of the semiconductor layer 14 is greater than about 70 nm, there is a possibility that a deep portion of the semiconductor layer 14 cannot be melted by irradiation with a pulsed laser to be hereinafter described, so that it is difficult to obtain a good crystalline film. In this preferred embodiment, the thickness of the semiconductor layer 14 is set to about 40 nm, for example.

In the case that the semiconductor layer 14 is formed by PECVD, a large amount of hydrogen is undesirably contained in the semiconductor layer 14. Accordingly, after forming the semiconductor layer 14, this hydrogen is preferably removed by heating at about 450° C. for about 2 hours, for example, or by performing RTA (Rapid Thermal Annealing) with ultraviolet light.

As shown in FIG. 2A, a resist mask 14A is formed on the semiconductor layer 14 to perform dry etching by using the resist mask 14A, thereby forming a plurality of projections 15 on the semiconductor layer 14 as shown in FIG. 2B. These projections 15 are intended to form the distribution of thickness of the semiconductor layer 14 and to thereby selectively form a crystal core at each projection 15 by irradiation with a pulsed laser in the third step to be hereinafter described. FIG. 3 shows the results of simulation of changes in temperature of the interface between the semiconductor layer 14 and the silicon oxide film 13 when the semiconductor layer 14 was once irradiated with a pulsed laser having a pulse width of 150 ns in the cases that the thickness of the semiconductor layer 14 was set to 22 nm and 40 nm. As apparent from FIG. 3, the solidification of the semiconductor layer 14 in the case of setting the thickness of the semiconductor layer 14 to 40 nm starts earlier than in the case of setting the thickness of the semiconductor layer 14 to 22 nm. Accordingly, by forming the thickness distribution of the semiconductor layer 14 due to the projections 15, it is considered that the selective formation of a crystal core can be effected at each projection 15 having a larger thickness.

To selectively form a crystal core at each projection 15 and thereby form a good-quality crystalline film, the height h of each projection 15 is preferably set in the range of about 1 nm to less than or equal to about ¼ of the thickness of the semiconductor layer 14. In the case that the thickness of the semiconductor layer 14 is set to about 40 nm as in this preferred embodiment, the height h of each projection 15 is preferably set in the range of about 1 nm to about 10 nm. By setting the height h to a relatively small value as mentioned above, the planarity of a crystalline film to be formed later can be improved, so that the performance of a TFT to be fabricated later by using this crystalline film can be improved. Further, the crystal core can be selectively formed by only forming in the semiconductor layer 14 a region where the solidification starts slightly earlier. Accordingly, the thickness distribution of the semiconductor layer 14 is not required to be made remarkably large. Further, each projection 15 must have the height h set to a relatively small value of about 1 nm or more in consideration of an etching accuracy or the like. For example, the height h of each projection 15 is set to about 7 nm, and the thickness of the semiconductor layer 14 except each projection 15 is set to about 33 nm.

The dimension d of each projection 15 in a direction parallel to the flat surface of the substrate 11 is preferably set to a value similar to that of a crystal grain to be fabricated. For example, the dimension d is preferably set in the range of about 3 $\mu$m to about 18 $\mu$m. If the dimension d is less than about 3 $\mu$m or greater than about 18 $\mu$m, the thickness of the semiconductor layer 14 becomes substantially constant and the effect of formation of the thickness distribution due to each projection 15 cannot be obtained. For example, each projection 15 has a square shape as viewed in plan wherein the dimension d is set to about 3 $\mu$m. In this case, the dimension d means the length of each side of the square. The shape of each projection 15 as viewed in plan is not limited to a square shape, but a rectangular shape, circular shape, or any other shapes may be adopted. In the case of a rectangular shape, the dimension d means the length of each longer side of the rectangle. In the case of a circular shape, the dimension d means the diameter of the circle. In the case of any other shapes, the dimension d means the maximum dimension of each shape.

Further, each projection 15 has a side wall surface 15A substantially perpendicular to the flat surface of the substrate 11. With this configuration, the step of forming each projection 15 can be simplified. The wording of "substantially perpendicular" means not only the case where the side wall surface 15A is accurately perpendicular to the flat surface of the substrate 11, but also the case where the side wall surface 15A is slightly tapered. In this regard, the side wall surface 15A is slightly inclined with respect to the normal to the flat surface of the substrate 11. The sectional shape of each projection 15 is not always symmetrical with respect to a laterally central line, but may be asymmetrical.

The position of each projection 15 may be determined according to the arrangement of TFTs to be fabricated later.

As shown in FIG. 4A, the semiconductor layer 14 is irradiated with an energy beam E by a pulsed laser a number of times to thereby heat the semiconductor layer 14. As a result, a crystalline film 16 including a number of crystal grains (silicon) 16A respectively corresponding to the projections 15 is formed as shown in FIG. 4B.

For example, an XeCl excimer laser may be used as the pulsed laser. The irradiation is preferably performed in an atmosphere of inert gas, such as nitrogen and the like. Further, the energy beam E may be a surface beam for the purpose of uniformly irradiating the surface of the semiconductor layer 14.

The heating conditions for the semiconductor layer 14 are set so that each crystal grain 16A has a specific plane orientation with respect to a direction perpendicular to the flat surface of the substrate 11. More specifically, the heating conditions are set by adjusting the irradiation intensity, irradiation frequency (the number of pulses), and pulse width as parameters on the XeCl excimer laser. For example, the heating conditions are set so that each crystal grain 16A has {111} plane orientations with respect to a direction perpendicular to the flat surface of the substrate 11. In the case of silicon, the surface energy is stable in the {111} plane orientations, and solidification occurs accordingly so as to minimize the surface energy.

The intensity of the energy beam E is preferably set so that the temperature of the semiconductor layer 14 becomes a temperature at which the crystal formed by the previous irradiation is not all melted, but a part of the crystal remains crystalline. For example, the intensity of the energy beam E is preferably set in the range of about 420 mJ/cm$^2$ to about 450 mJ/cm$^2$. It is needless to say that these values for the intensity of the energy beam E include an error due to a measuring instrument for measuring the intensity of the energy beam E.

The irradiation frequency of the energy beam E by the pulsed laser is preferably set so that each crystal grain 16A can be formed to have a desired size and that the plane orientations of each crystal grain 16A with respect to a direction perpendicular to the flat surface of the substrate 11 become {111} plane orientations. For example, the irradiation frequency is preferably set in the range of about 20 to about 200. If the irradiation frequency is less than 20, the fusion of each crystal grain 16A does not proceed and variations in plane orientations of each crystal grain 16A are not sufficiently eliminated. Conversely, if the irradiation frequency is greater than 200, the total evaporative amount of silicon becomes large. For example, the irradiation frequency is set to 100 in this preferred embodiment.

The pulse width of the energy beam E by the pulsed laser is preferably set to about 150 ns, for example. That is, the irradiation time by one pulse is as very short as 150 ns, so that it is effective for a reduction in process temperature. Accordingly, a plastic material can be used as the material of the substrate 11, thereby allowing a reduction in manufacturing cost.

The pulse spacing of the energy beam E by the pulsed laser is preferably set to about 0.1 s, for example. With this pulse spacing, the silicon melted by the previous irradiation with one pulse is completely solidified. According to an embodiment, the heating conditions include pulse width: 150 ns; pulse spacing: 0.1 s; irradiation frequency: 100; and irradiation intensity: about 420 mJ/cm$^2$.

Under the above heating conditions, the first pulse is applied to the semiconductor layer 14 to heat the same. At this time, the semiconductor layer (amorphous silicon) 14 is melted and then starts to be solidified, wherein the solidification starts earlier at each projection 15 having a relatively large thickness than in the other region. As a result, a crystal core 16B is selectively formed at each projection 15 (see FIG. 4A). In the case that the sectional shape of each projection 15 is symmetrical with respect to the laterally central position as shown in FIG. 4A, the crystal core 16B is formed at a position corresponding to the lateral center of each projection 15. In the case that the sectional shape of each projection 15 is asymmetrical, the crystal core 16B is formed at a position where the thickness of each projection 15 is largest.

Thereafter, the second pulse is applied under the same heating conditions using the energy beam E whose intensity is properly set. As a result, each crystal core 16B formed by the previous irradiation or a crystal grown from this crystal core 16B is not all melted, but partially remains crystalline. Then, such a crystalline portion serves as a new crystal core to form a larger crystal. Thus, the irradiation is repeated to perform the heating process a number of times, thereby growing the crystal from the crystal core 16B to obtain the crystalline film 16 having the silicon crystal grains 16A respectively corresponding to the projections 15 as shown in FIG. 4B. By controlling the heating conditions, particularly the irradiation frequency of the energy beam E, the size of each crystal grain 16A is controlled and variations in plane orientations of each crystal grain 16A are reduced, so that the crystal growth proceeds with each crystal grain 16A being preferentially oriented in the {111} plane orientations with respect to a direction perpendicular to the flat surface of the substrate 11.

After forming the crystalline film 16 as mentioned above, a TFT forming step shown in FIG. 5A is performed. In this regard, a number of TFTs 17 are formed by a general method using the crystal grains 16A of the crystalline film 16 as operating regions (channel regions). The forming step for the TFTs 17 includes formation of a gate oxide film after isolation, formation of a source region and a drain region after formation of a gate electrode, formation of an interlayer dielectric film, formation of a contact hole, and metallization.

Figure 5A:
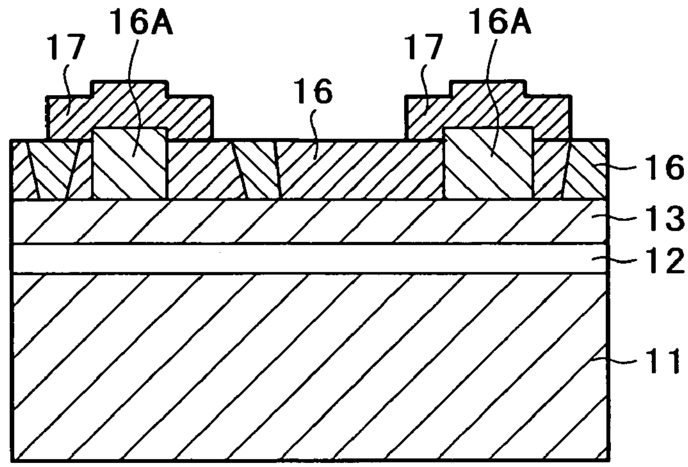
FIGS. 5A and 5B are sectional views showing the fourth step subsequent to the third step shown in FIGS. 4A and 4B.
Figure 5B:
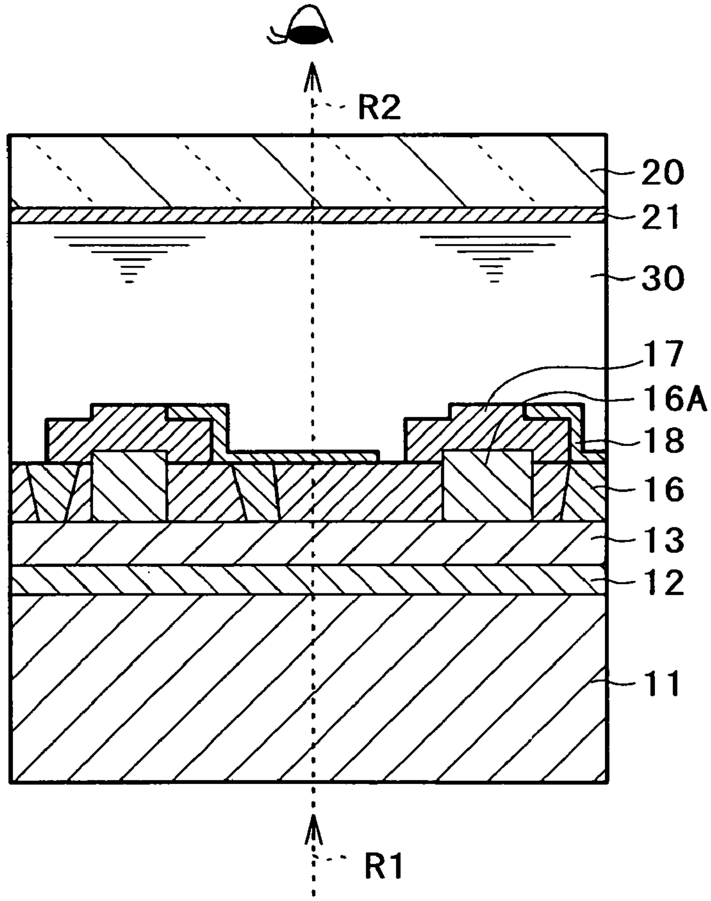

After forming the TFTs 17, a transmission type liquid crystal display as shown in FIG. 5B is manufactured through various steps including formation of pixel electrodes 18 from ITO, bonding of the substrate 11 and an opposed substrate 20 having a transparent electrode 21, and sealing with a liquid crystal 30; ITO represent Indium-Tin Oxide which is a composite oxide of Indium (In) and tin (Sn).

When a predetermined voltage is applied between any one of the pixel electrodes 18 and the transparent electrode 21, the oriented condition of the liquid crystal 30 is changed to cause a change in transmittance. Incident light R1 having entered the pixel electrodes 18 from a backlight (not shown) is transmitted through the liquid crystal 30 and is output as transmitted light R2. Since the height h of each projection 15 is small, the planarity of the crystalline film 16 is improved to thereby improve the performance of each TFT 17 formed on the crystalline film 16. Further, the operating region (channel region) of each TFT 17 is formed by using each crystal grain 16A in the crystalline film 16. Accordingly, no grain boundary is present in the operating region, so that the device characteristics and reliability of each TFT 17 can be improved. Further, since each crystal grain 16A has {111} plane orientations with respect to a direction perpendicular to the flat surface of the substrate 11, the interfacial characteristics between the gate dielectric film and the silicon crystal in each TFT 17 can be made uniform, thereby improving the uniformity of the TFTs 17.

Since the height h of each projection 15 is set in the range of about 1 nm to less than or equal to about ¼ of the thickness of the semiconductor layer 14, the planarity of the crystalline film 16 can be improved. Further, since the side wall surface 15A of each projection 15 is substantially perpendicular to the flat surface of the substrate 11, the forming step for each projection 15 can be simplified. Further, the crystalline film 16 including the crystal grains 16A each having {111} plane orientations with respect to a direction perpendicular to the flat surface of the substrate 11 so as to respectively correspond to the projections 15 are formed by performing the heating process plural times to the semiconductor layer 14 with a pulsed laser. Accordingly, the crystal grains 16A controlled in size and plane orientation can be respectively formed at the positions of the projections 15. Accordingly, the liquid crystal display having the TFTs 17 having high performance and uniform characteristics can be formed by using the crystal grains 16A in the crystalline film 16 as operating regions in an embodiment.

An example illustrative of the present invention will now be described without limitation to the scope of the present invention.

As similarly to the above-mentioned preferred embodiment, a crystalline film 16 was formed in the following manner. In this regard, a glass substrate 11 was used, and a silicon nitride film ($SiN_x$) 12 having a thickness of 50 nm, a silicon oxide film ($SiO_2$) 13 having a thickness of 120 nm, and a semiconductor layer (amorphous silicon) 14 having a thickness of 40 nm were sequentially formed on the substrate 11. Thereafter, a number of square projections 15 each having a side of 3 μm were formed on the semiconductor layer 14. The height h of each projection 15 was set to 7 nm, and the thickness of the semiconductor layer 14 except each projection 15 was set to 33 nm. This semiconductor layer 14 was irradiated with a pulsed laser under the following heating conditions to thereby form the crystalline film 16. The heating conditions included pulse width: 150 ns; pulse spacing: 0.1 s; irradiation frequency: 100; and irradiation intensity: about 420 mJ/cm$^2$.

In the crystalline film 16 thus obtained, each projection 15 was observed by using an SEM (Scanning Electron Microscope), and the crystal orientation at each projection 15 was investigated by EBSP (Electron Back Scattering Pattern) measurement. As illustrated, (A) of FIG. 6 is illustrative of an SEM photograph of each projection 15, (B) of FIG. 6 is a crystal orientation map showing a crystal orientation in a direction perpendicular to the flat surface of the substrate 11, and (C) and (D) of FIG. 6 are crystal orientation maps showing crystal orientations in two different directions in the plane of the flat surface of the substrate 11.

Figure 6:
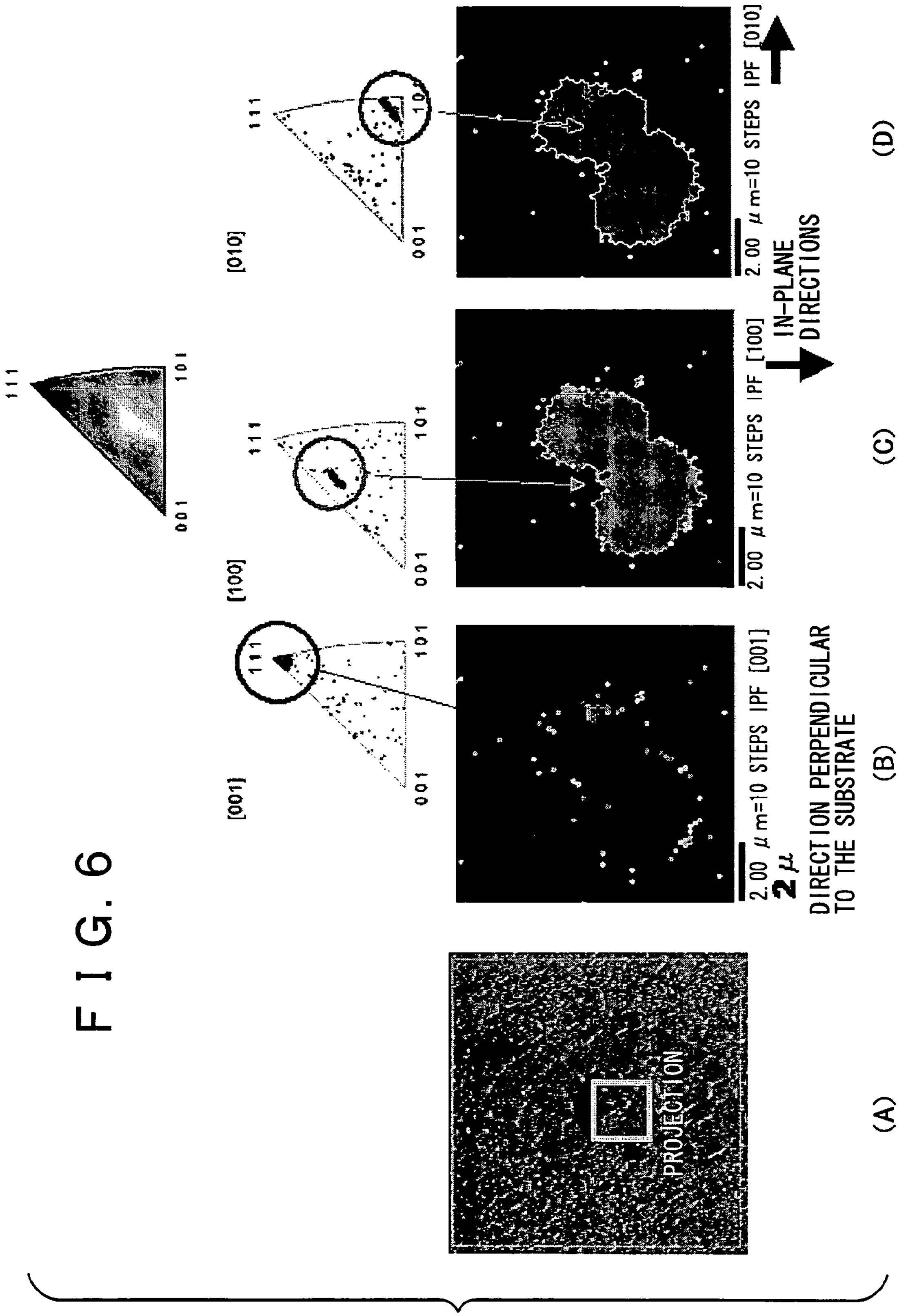
FIG. 6 illustrates an SEM of each projection, and (B), (C), and (D) of FIG. 6 are crystal orientation maps according to an embodiment of the present invention.

As apparent from (A) and (B) of FIG. 6, a crystal region having a size of about 6 $\mu$m is formed about each projection 15 so as to be preferentially oriented in the {111} plane orientations with respect to a direction perpendicular to the flat surface of the substrate 11. Further, as apparent from (B) to (D) of FIG. 6, this crystal region has the same crystal orientation in the three directions. In this regard, this crystal region has the same crystal orientation in the direction perpendicular to the flat surface of the substrate 11 and in the two different directions included in the plane of the flat surface of the substrate 11, so that this crystal region may be regarded as one crystal grain. Thus, the crystal grain 16A having a size of about 6 $\mu$m could be formed about each projection 15 so as to be preferentially oriented in the {111} plane orientations with respect to a direction perpendicular to the flat surface of the substrate 11. In this regard, it has been found that the size and plane orientation of the crystal grain 16A to be formed at each projection 15 can be controlled by forming each projection on the semiconductor layer 14 and suitably setting the heating conditions for the semiconductor layer 14 pursuant to an embodiment of the present invention.

Having thus described a preferred embodiment and example of the present invention, it should be noted that the present invention is not limited to the above preferred embodiment and example, but various modifications may be made. For example, while the crystalline film 16 is formed of a crystalline silicon material in the above preferred embodiment and example, the present invention is similarly applicable also to the case where the crystalline film is formed of any crystalline semiconductor materials other than silicon. For example, the crystalline film can be formed from a crystalline semiconductor material, such as from any suitable covalent bond semiconductors having a diamond type crystal structure, preferably any other suitable IV semiconductors. The IV semiconductors include element semiconductors such as silicon, germanium (Ge), and carbon (C), and any semiconductors including at least one type of material, such as silicon, germanium, carbon, and the like. Examples of such semiconductors include SiGe, SiC and the like.

In the above preferred embodiment and example, the semiconductor layer 14 includes an amorphous silicon. In an alternate embodiment, the semiconductor layer can include polycrystalline silicon and the like.

In the case of manufacturing a crystalline film from any crystalline semiconductor materials other than silicon, a polycrystalline semiconductor layer can be formed rather than the amorphous semiconductor layer according to an embodiment.

In the above preferred embodiment and example, an XeCl excimer laser is used as the pulsed laser. It should be appreciated that any lasers other than the XeCl excimer laser can be used.

In the above preferred embodiment and example, the irradiation conditions are illustrated. However, the heating conditions in the present invention are not limited to those illustrated above.

In the above preferred embodiment and example, the heating conditions are provided such that each crystal grain 16A has the {111} plane orientations with respect to a direction perpendicular to the flat surface of the substrate 11. As a modification, each crystal grain 16A can be preferentially oriented in any plane orientations other than the {111} plane orientations, such as in the {100} plane orientations by adjusting the heating conditions according to an embodiment.

Further, the material and thickness of each layer and the deposition method and conditions mentioned in the above preferred embodiment and example are illustrative of the present invention, and thus it should be appreciated that any other suitable materials and thicknesses and any other suitable deposition methods and conditions can be utilized.

While the specific configuration of the liquid crystal display is described in the above preferred embodiment, it should be appreciated that all the layers are not necessarily required, or another layer may be added.

While the liquid crystal display including the TFTs 17 is fabricated in the above preferred embodiment, any other suitable displays such as an organic electroluminescence display and the like can be fabricated instead.

While the TFTs 17 are formed by using the crystalline film 16 in the above preferred embodiment, the present invention is applicable also to the case of manufacturing a semiconductor device having any other suitable semiconductor elements, such as a solar cell and the like.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A manufacturing method for a crystalline semiconductor material including a plurality of semiconductor crystal grains, comprising:

forming an amorphous or polycrystalline semiconductor layer on a substrate having a flat surface;

forming a plurality of projections each having a side wall surface substantially perpendicular to the flat surface of said substrate, a height ranging from about 1 nm to less than or equal to about ¼ of a thickness of said semiconductor layer, and a lateral dimension that ranges from about 3 $\mu$m to about 18 $\mu$m in a direction parallel to said flat surface of said substrate; and heating said semiconductor layer a plurality of times by using a pulsed laser thereby forming said crystalline semiconductor material including said crystal grains each having a specific plane orientation with respect to a direction perpendicular to said flat surface of said substrate so that said crystal grains respectively correspond to said projections.

2. The manufacturing method for a crystalline semiconductor material according to claim 1, wherein the thickness of said semiconductor layer ranges from about 40 nm to about 70 nm.

3. The manufacturing method for a crystalline semiconductor material according to claim 1, wherein said semiconductor layer includes at least one type of material selected from the group consisting of silicon (Si), germanium (Ge), and carbon (C).

4. The manufacturing method for a crystalline semiconductor material according to claim 3, further comprising the step of forming a silicon oxide film between said substrate and said semiconductor layer.

5. The manufacturing method for a crystalline semiconductor material according to claim 1, wherein said pulsed laser comprises an excimer laser.

6. The manufacturing method for a crystalline semiconductor material according to claim 5, wherein the irradiation intensity of an energy beam by said pulsed laser ranges from about 420 $mJ/cm^2$ to about 450 $mJ/cm^2$.

7. The manufacturing method for a crystalline semiconductor material according to claim 5, wherein the pulse width of an energy beam by said pulsed laser includes about 150 ns.

8. The manufacturing method for a crystalline semiconductor material according to claim 7, wherein the irradiation frequency of said energy beam ranges from about 20 to about 200.

9. The manufacturing method for a crystalline semiconductor material according to claim 1, wherein said substrate is selected from the group consisting of a glass substrate and a plastic substrate.

10. A manufacturing method for a semiconductor device using a crystalline film including a plurality of semiconductor crystal grains, comprising:

forming an amorphous or polycrystalline semiconductor layer on a substrate having a flat surface;

forming a plurality of projections each having a side wall surface substantially perpendicular to said flat surface of said substrate, a height ranging from about 1 nm to less than or equal to about ¼ of a thickness of said semiconductor layer, and a lateral dimension ranging from about 3 $\mu$m to about 18 $\mu$m in a direction parallel to said flat surface of said substrate;

heating said semiconductor layer plurality of times by using a pulsed laser thereby forming said crystalline film including said crystal grains each having a specific plane orientation with respect to a direction perpendicular to said flat surface of said substrate so that said crystal grains respectively correspond to said projections; and forming a plurality of semiconductor elements so that said crystal grains included in said crystalline film function as operating regions of said semiconductor elements.

11. The manufacturing method for a semiconductor device according to claim 10, wherein the thickness of said semiconductor layer ranges from about 40 nm to about 70 nm.

12. The manufacturing method for a semiconductor device according to claim 10, wherein said semiconductor layer includes at least one type of material selected from the group consisting of silicon (Si), germanium (Ge), and carbon (C).

13. The manufacturing method for a semiconductor device according to claim 12, further comprising forming a silicon oxide film between said substrate and said semiconductor layer.

14. The manufacturing method for a semiconductor device according to claim 10, wherein said pulsed laser comprises an excimer laser.

15. The manufacturing method for a semiconductor device according to claim 14, wherein the irradiation intensity of an energy beam by said pulsed laser ranges from about 420 $mJ/cm^2$ to about 450 $mJ/cm^2$.

16. The manufacturing method for a semiconductor device according to claim 14, wherein the pulse width of an energy beam by said pulsed laser is about 150 ns.

17. The manufacturing method for a semiconductor device according to claim 16, wherein the irradiation frequency of said energy beam ranges from about 20 to about 200.

18. The manufacturing method for a semiconductor device according to claim 10, wherein said substrate is selected from the group consisting of a glass substrate and a plastic substrate.

* * * * *